(12) United States Patent
Clifton et al.

(10) Patent No.: US 7,196,583 B2
(45) Date of Patent: Mar. 27, 2007

(54) POWER CONTROL OF A POWER AMPLIFIER

(75) Inventors: John Christopher Clifton, Hook (GB); Simon Denny, Basingstoke (GB); Anthony Eaton, Hook (GB)

(73) Assignee: Sony United Kingdom Limited, Weybridge (GB)

( * ) Notice: Subject to any disclaimer, the term of this patent is extended or adjusted under 35 U.S.C. 154(b) by 96 days.

(21) Appl. No.: 11/176,038

(22) Filed: Jul. 7, 2005

(65) Prior Publication Data

US 2006/0006943 A1    Jan. 12, 2006

(30) Foreign Application Priority Data

Jul. 8, 2004    (GB) ................. 0415354.0
Aug. 27, 2004    (GB) ................. 0419250.6

(51) Int. Cl.
*H03G 3/10*    (2006.01)

(52) U.S. Cl. ....................... 330/285; 330/296

(58) Field of Classification Search ........... 330/285, 330/296, 297, 129, 136, 207 P, 298
See application file for complete search history.

(56) References Cited

U.S. PATENT DOCUMENTS

| | | | |
|---|---|---|---|
| 6,675,000 B1 | 1/2004 | Ichikawa | |
| 6,724,252 B2 | 4/2004 | Ngo et al. | |
| 6,998,919 B2 * | 2/2006 | Gamero et al. | 330/289 |
| 7,078,974 B2 * | 7/2006 | Matsushita et al. | 330/285 |
| 7,106,137 B2 * | 9/2006 | Dupuis et al. | 330/285 |
| 7,113,034 B2 * | 9/2006 | Arai et al. | 330/133 |
| 2004/0061555 A1 | 4/2004 | Lynch | |

(Continued)

FOREIGN PATENT DOCUMENTS

| | | |
|---|---|---|
| EP | 1 381 154 | 1/2004 |
| GB | 2 345 212 | 6/2000 |
| WO | WO 2004/019486 | 3/2004 |

OTHER PUBLICATIONS

N. Saka et al., "Low Standby Leakage Current Power Amplifier Module made with junction PHEMT technology", Gallium Arsenide Integrated Circuit (GaAsIC) Symposium 2003, 25th Annual Digest 2003, IEEE, Nov. 9-12, 2003.

(Continued)

*Primary Examiner*—Henry Choe
(74) *Attorney, Agent, or Firm*—Oblon, Spivak, McClelland, Maier & Neustadt, P.C.

(57) ABSTRACT

To effect power control of a power amplifier 2 having three amplifier stages 3, 4 and 5 used to amplify input signals modulated in accordance with a variable envelope modulation scheme, there is used a power amplifier 2 having a gain which reduces as the supply voltage to the power amplifier 2 reduces, and the output power $P_{OUT}$ of the power amplifier 2 is controlled by regulation of the supply voltage $V_S$. Taking advantage of the reduction in gain of the power amplifier 2, it is ensured that, in respect of each respective amplifier stage 3, 4 and 5 and at each respective value of the supply voltage in the voltage control range, the output power $P_{OUT}$ of the respective amplifier stage 3, 4 and 5 is less than the saturation output power $P_{SAT}$ of the respective amplifier stage 3, 4 and 5. As a result, distortion of the signal is reduced. The power control technique improves efficiency over known techniques of backing off the output power and using a variable gain amplifier stage to control the output power.

29 Claims, 5 Drawing Sheets

OTHER PUBLICATIONS

Feipeng Wang, et al., "Envelope Tracking Power Amplifier with Pre-Distortion Linearization for WLAN 802.11g" Microwave Symposium Digest, 2004 IEEE, XP-010727999, vol. 3, Jun. 6, 2004, pp. 1543-1546.

Biranchinath Sahu, et al., "System-Level Requirements of DC-DC Converters for Dynamic Power Supplies of Power Amplifiers", Proceedings from the 2002 IEEE Asia-Pacific Conference, XP-010602815, Aug. 6, 2002, pp. 149-152.

Jeonghyeon Cha, et al., "An Adaptive Bias Controlled Power Amplifier with a Load-Modulated Combining Scheme for High Efficiency and Linearity", 2003 IEEE MTT-S International Microwave Symposium Digest, XP-010644477, vol. 3 of 3, Jun. 8, 2003, pp. 81-84.

Nicolas Schlumpf, et al., "A fast modulator for dynamic supply linear RF power amplifier", European Solid-State Circuits Conference 2003, XP-010677275, Sep. 16, 2003, pp. 429-432.

J. Staudinger, et al., "High Efficiency CDMA RF Power Amplifier Using Dynamic Envelope Tracking Technique", Microwave Symposium Digest, 2000 IEEE, XP-010507475, vol. 2, Jun. 11, 2000, pp. 873-876.

* cited by examiner

POWER CONTROL OF A POWER AMPLIFIER

FIELD OF THE INVENTION

The present invention relates to power control of a power amplifier used to amplify a signal modulated in accordance with a variable envelope modulation scheme. The present invention has particular application to power amplifiers used in wireless communication networks, for example in accordance with the EDGE specification or the WCDMA specification.

DESCRIPTION OF RELATED ART

In wireless communication networks it is necessary to control the power of signals output by the mobile terminals, in particular to minimise inter-channel interference and to conserve power. Such power control may be done by control of the power amplifier used to amplify the modulated signals.

Many early wireless communication networks and in particular the first European digital cellular wireless networks used constant envelope modulation schemes, for example GMSK modulation as used in the GSM specification. The power control techniques used with such constant envelope modulation schemes are simple to implement and provide high efficiency, for example of up to 60%. This is due to the fact that constant envelope modulation schemes permit operation of the power amplifier in the saturated region.

Although several methods of power control exists, open loop supply regulation has been used extensively due to its simplicity and well controlled characteristics. As the output power from the power amplifier has a predictable relationship with the supply voltage over temperature and frequency, power detectors and couplers can be avoided, thus saving costs and reducing size. Fundamentally, the conventional supply regulation technique relies upon the supply voltage clipping the radio frequency output voltage. As a result, it is normally only considered valid for constant envelope modulation schemes because they are insensitive to the gross AM non-linearities associated with the power control technique.

More recent specifications for wireless communication networks take advantage of variable envelope modulation schemes. For example, the EDGE specification (which is an enhancement of the GSM specification) employs 3π/8-8PSK modulation and the WCDMA specification (which is a third-generation (3G) mobile wireless technology) employs HPSK modulation.

To effect power control of power amplifiers for variable envelope modulation schemes, it is normal to avoid the conventional type of supply regulation used for constant envelope modulation schemes as described above. This is because the clipping of the radio frequency output voltage caused by operation of the power amplifier in the saturated region results in AM-AM and AM-PM distortion which is unacceptable in the context of variable envelope modulation (AM: amplitude modulation; PM: phase modulation). Instead, with such variable envelope modulation schemes, the predominant power control technique used in practice has been to back-off the input power of the power amplifier by several dB into the linear region and to use a variable gain amplifier on the input side of the power amplifier. Adjustment of the input power to the power amplifier is used to control the output power. Hereinafter, this technique will be referred to as "the back-off variable gain amplifier technique".

Unfortunately, such backing-off of the input power into the linear region comes at the price of lower efficiency. In addition, the variable gain amplifier consumes a significant current, typically 20 to 50 mA which further degrades the efficiency of the power amplifier. The use of a variable gain amplifier has further disadvantages of increasing the die size and limiting the ability to meet the stringent wideband noise requirements for typical wireless communication network specifications such as GSM and EDGE.

The back-off variable gain amplifier technique has been used in the first commercial mobile terminals having a capability of operation under the EDGE specification. However, it would be highly desirable to improve the efficiency in order to increase the battery life of the mobile terminal.

One proposal for enhancing efficiency in the case of the EDGE specification has been to implement power control using a polar loop. However, these implementations are typically associated with a high degree of complexity and do not allow an elegant migration part to the WDCMA specification or other 3G specifications. Furthermore, the efficiency potential of polar loop techniques for the EDGE specification are often not fully realised due to the current consumption requirements within the inherent correction loops.

It would be desirable to develop a power control technique which avoids or at least reduces the disadvantages with the known power control techniques set out above.

BRIEF SUMMARY OF THE INVENTION

According to a first aspect of the present invention, there is a method of providing power control of a power amplifier used to amplify input signals modulated in accordance with a variable envelope modulation scheme, the power control being effective to control the output power of signals amplified by the power amplifier to be within a predetermined power control range, the method comprising:

providing a power amplifier having a gain which reduces as the supply voltage to the power amplifier reduces, the change in gain over the voltage supply range of the power amplifier being at least the change in output power over the predetermined power control range; and during operation of said power amplifier to amplify input signals modulated in accordance with the variable envelope modulation scheme, controlling the output power of the power amplifier by regulation of the supply voltage to the power amplifier over a voltage control range, the power amplifier being arranged to provide that at each respective value of the supply voltage in the voltage control range the output power of the power amplifier is less than the saturation output power of the power amplifier.

According to a second aspect of the present invention there is provided a power amplifier power control circuit which is capable of performing a similar power control technique to the method in accordance with the first aspect of the present invention.

The present invention performs power control by regulation of the supply voltage, but in a different manner the conventional supply regulation technique for a constant envelope modulation scheme, as described above. In particular, instead of operating the power amplifier in saturation, the present invention takes advantage of property of some power amplifiers that the gain reduces with the supply voltage. Thus, the present invention uses a power amplifier having a change of gain over the voltage supply range which is at least the required change in output power over the predetermined power control range. As a result, the power control over this predetermined power control range can be achieved entirely by the supply regulation. Therefore the present invention therefore limits or avoids altogether the need to include a variable gain amplifier to change the input power. This in turn reduces or avoids the various disadvantages of a variable gain amplifier as set out above.

The power amplifier is arranged to provide that the actual output power is less than the saturation output power of the power amplifier for each value of the supply voltage in the control range. This prevents the distortion which is inherent in clipping of the amplified signal at the saturation output level. In general, the saturation output power of a power amplifier changes in proportion to the square of the supply voltage. To maintain the actual output power below the saturation output power, the present invention takes advantage of the reduction in the gain as the supply voltage decreases.

With the power control technique of the present invention, the efficiency of the amplification by the power amplifier is increased as compared to the efficiency achievable by the back-off variable gain amplifier technique described above. Observing that efficiency decreases as the power amplifier is backed-off from its saturation region into its linear region, the efficiency gain of the present invention may be understood in general terms on the basis that the present invention allows operation of the power amplifier closer to the saturation region across the predetermined power control range as a whole. Such an improvement in efficiency has the practical benefit to users of increasing battery life.

At the same time, the present invention allows the power control circuitry to be implemented with a much lower level of complexity as compared to the polar loop techniques described above. This is because the circuitry needed to implement the supply regulation is inherently much simpler than the polar loop circuitry which requires complex correction loops.

To achieve a maximum predetermined power control range, the voltage control range is the full voltage supply range. Depending on the power amplifier and the desired power control range associated with the wireless communication network specification in accordance with which the input signal is modulated, it may be possible to apply the present invention for power control over the entire power control range associated with the specification. In this case, the predetermined power control range is that entire power control range associated with the specification. In the case that the entire power control range associated with the wireless communication network specification is greater than the predetermined power control range achievable from the power amplifier, the technique of the present invention may be applied in combination with another power control technique, for example using a variable gain amplifier to control the power of the input signal. In this case, the predetermined power control range is a part of the entire power control range associated with the wireless communication network specification. Although a variable gain amplifier is not avoided altogether, the requirements for power control from the variable gain amplifier are reduced and so the disadvantages of a variable gain amplifier as set out above are similarly reduced.

In general, the present invention may be applied to any variable envelope modulations scheme and has particular application to the $3\pi/8$-8PSK modulation used in accordance with the EDGE specification, in which the power control range associated with the specification is 0 dBm to 26 dBm for the high frequency bands (DC1800, PCS1900) and 5 dBm to 27 dBm for the low frequency bands (GSM850, GSM900); and the HPSK modulation used in accordance with the WCDMA specification, in which the power control range associated with the specification is −50 dBm to 24 dBm.

The present invention has particular advantage when applied to a dual mode mobile terminal in which there is a second mode in which the power amplifier is used to amplify input signals modulated in accordance with a constant envelope modulation scheme. In this case, during operation of said power amplifier to amplify input signals modulated in accordance with the constant envelope modulation scheme, the output power of the power amplifier is controlled by regulation of the supply voltage to the power amplifier over a further voltage control range.

Such a dual-mode mobile terminal is highly desirable in order to allow selective operation with both existing wireless communication networks employing constant envelope modulation, such as the GSM specification, and an incoming wireless communication networks employing variable envelope modulation, such as the EDGE specification or the WCDMA specification. In particular, the present invention allows the same supply regulation circuit to be employed in both modes of operation. This significantly reduces the circuit scale.

Similarly, the present invention may be applied in the same mobile terminal to signal modulated in accordance with different variable envelope modulation schemes. In this case, the same advantage of reducing the circuit scale is achieved because the same supply regulation circuitry may be used in each case.

The present invention may be applied to a typical power amplifier having a plurality of amplifier stages, usually three amplifier stages. In this case, the supply regulation comprises regulating the supply voltage to at least one amplifier stage. To achieve a sufficient variation of gain for a desired power control range, it may be necessary to regulate the supply voltage to each one of the amplifier stages.

In the case of the power amplifier comprising plural amplifier stages, preferably the amplifier stages are arranged to provide that, in respect of each respective amplifier stage, at each respective value of the supply voltage in the voltage control range the output power of the respective amplifier stage is less than the saturation output power of the respective amplifier stage.

In this case, the output of the final amplifier stage is of course the output of the power amplifier. By controlling the output power of each amplifier stage in this manner, it is possible to prevent each amplifier stage from saturating. This achieves the advantage of limiting the distortion which would otherwise occur when the output of an amplifier stage saturates and is therefore clipped.

A preferred feature is that, across the voltage control range of the supply voltage, the gain of the power amplifier in decibels reduces at rate which is no more than the rate at which the saturation output power of the power amplifier in decibels reduces.

This provides the advantage of improving the efficiency. This may be understood by considering the fact that the actual output power is maintained below the saturation output power across the entire control range of the supply voltage. In general, such back-off of the power amplifier reduces efficiency. However, with this preferred feature, it is possible to minimise the back-off of the output power at the maximum supply voltage in the control range. Consequently, at lower supply voltages in the control range, the rate of reduction of the gain of the power amplifier ensures that the actual output power remains below the saturation output power across the entire control range. At the maximum supply voltage in the control range, by minimising the back-off of the output power, the efficiency is maximised. The maximum supply voltage is the most important part of the control range in which to maximise efficiency, because this is the part of the control range which experiences the highest absolute power loss (for a given efficiency) because the output power is at its highest level. Preferably, from the point of view of maximising efficiency, the gain of the power amplifier and decibels reduces at a rate equal to the rate at which the saturation output power of the power amplifier in decibels reduces.

To allow a better understanding, an embodiment of the present invention will now be described by way of non-limitative example with reference to the accompanying drawings.

DETAILED DESCRIPTION OF THE INVENTION

Figure 1:
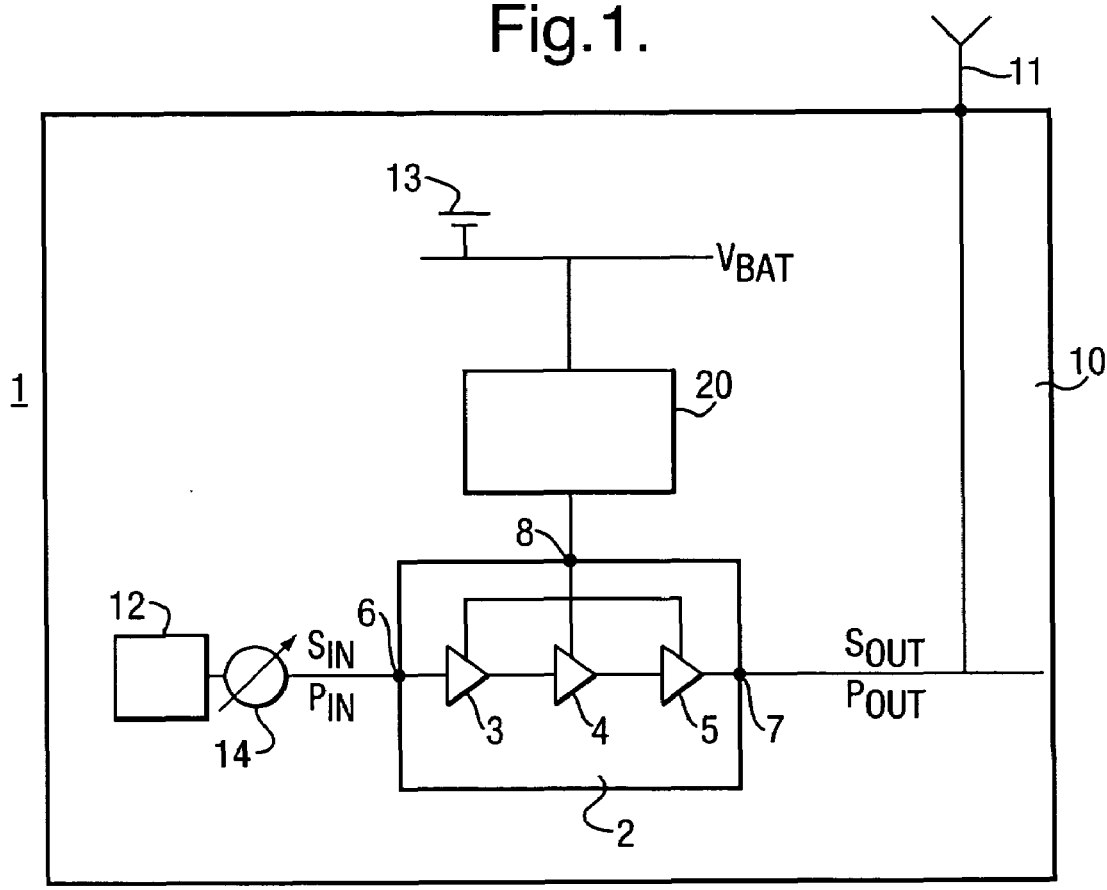
FIG. 1 is a diagram of a power amplifier power control circuit.

A power amplifier power control circuit 1 which embodies the present invention is shown in FIG. 1. The power amplifier power control circuit 1 has a power amplifier 2 which comprises three amplifier stages 3, 4 and 5 connected in series. An input signal $S_{IN}$ having an input power $P_{IN}$ is supplied to the input 6 of the power amplifier 2. The input signal $S_{IN}$ is amplified successively by the amplifier stages 3, 4 and 5 to produce an output signal $S_{OUT}$ at the output 7 of the power amplifier 2 having an output power $P_{OUT}$.

The power amplifier power control circuit 1 is provided inside a mobile terminal 10 for use with a wireless communication network. The output signal $S_{OUT}$ is supplied to an antenna 11 of the mobile terminal 10 for transmission. The input signal $S_{IN}$ is generated by the signal processing circuit 12 of the mobile terminal 10 and is modulated in accordance with the variable envelope modulation scheme of the specification of the wireless communication network in which the terminal 10 is to be used. For example, the variable envelope modulation scheme may be 3π/8-8PSK modulation in accordance with the EDGE specification or may be HPSK modulation in accordance with the WCDMA specification.

The signal processing circuit 12 is of conventional form, for example comprising an RF transceiver which produces the input signal $S_{IN}$, preceded by a baseband integrated circuit (digital signal processor).

The input signal $S_{IN}$ can be supplied from the signal processing circuit 12 to the power amplifier through an optional variable element 14 which may a variable gain amplifier or a variable attenuator. The purpose of the variable element 14 is described below.

The output power $P_{OUT}$ needs to be controlled within a power control range associated with the specification of the wireless communication network in question. These power control ranges are defined in the relevant ETSI documents defining the specification. The main ones are: 0 dBm to 26 dBM in the case of the DCS1800 and PCS 1900 bands of EDGE specification, class E2; 5 dBm to 27 dBm in the case of GSM850 and the GSM900 bands of the EDGE specification, class E2; and −50 dBm to 24 dBm in the case of the WCDMA specification.

Ignoring the effect of the optional variable element 14, the power amplifier controls circuit 1 provides power control over a predetermined power control range. Depending on the power amplifier 2 (as described below) and on the specification of the wireless communication network, the predetermined power control range over which power control is achieved by the power amplifier control circuit 1 may be either (1) the entire power control range associated with the wireless communication network specification in question, or (2) only a part of the entire power control range associated with the specification. In the former case (1), the variable element 14 may be omitted altogether. In the latter case (2), the additional power control over the remainder of the entire power control range outside the "predetermined" power control range may be provided by the variable element 14. In particular, the variable element 14 is controlled to adjust the power of the signal output from the signal processing circuit 12 and thereby to control the input power $P_{IN}$ of the input signal $S_{IN}$ and hence the output power $P_{OUT}$ of the output signal $S_{OUT}$. Such control by the variable element 14 is in itself conventional.

Starting with the power control range associated with the wireless communication network specification in question, there is applied an offset to account for power losses between the output of the power amplifier 2 and the antenna 13, for example in the antenna switch and connectors (not shown).

The power control over the predetermined power control range is achieved by the power amplifier power control circuit 1 as follows.

The power amplifier power control circuit 1 has a supply regulation circuit 20 which controls the supply voltage $V_S$ supplied to the supply voltage terminal 8 of the power amplifier 2. In use, the variation of the supply voltage $V_S$ controls the output power $P_{OUT}$ of the power amplifier 2, as described in more detail below.

Figure 2:
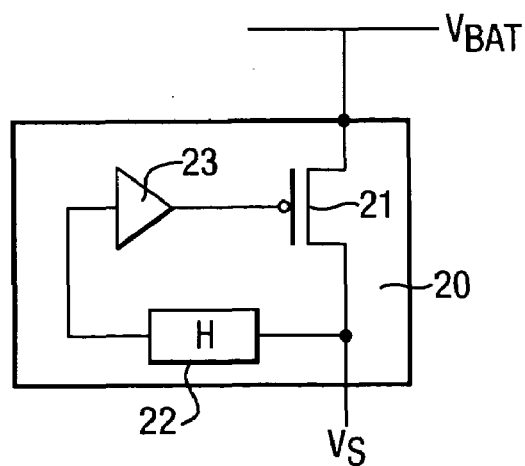
FIG. 2 is a diagram of the supply regulation circuit of the power amplifier power control circuit of FIG. 1.

The supply regulation circuit 20 may in itself be of any conventional form for a supply regulation circuit. One possibility is for the supply regulation circuit 20 to be a conventional open-loop PMOS supply regulation circuit as shown in FIG. 2. In this case, the supply regulation circuit 20 includes a PMOS transistor 21 connected in series between the voltage supply line $V_{BAT}$ supplying a voltage from the battery 13 of the mobile terminal 10. The PMOS transistor 21 acts as a control element to control the supply voltage $V_S$ output from the supply regulation circuit 20 to the power amplifier 2, effectively by acting as a variable resister in accordance with the voltage supplied to the gate of the PMOS transistor 21. The supply regulation circuit 20 further includes a feedback loop 22 which detects the level of supply voltage $V_S$ and feeds the detected level back to a comparator 23. The comparator 23 acts as an error detector to detect the error between the fed back level of the supply voltage $V_S$ and the desired supply voltage. The output of the comparator 23 is connected to the gate of the PMOS transistor 21 to effect control in accordance with the detected error.

As an alternative, the supply regulation circuit 20 may be based on a DC-DC converter. A first possibility is to use an ideal DC-DC converter. A second possibility is to use an ideal, fast DC-DC converter to perform envelope tracking and power control. This latter possibility may require the use of AM-AM correction loops which achieves improved efficiency at the expense of complexity.

Figure 3:
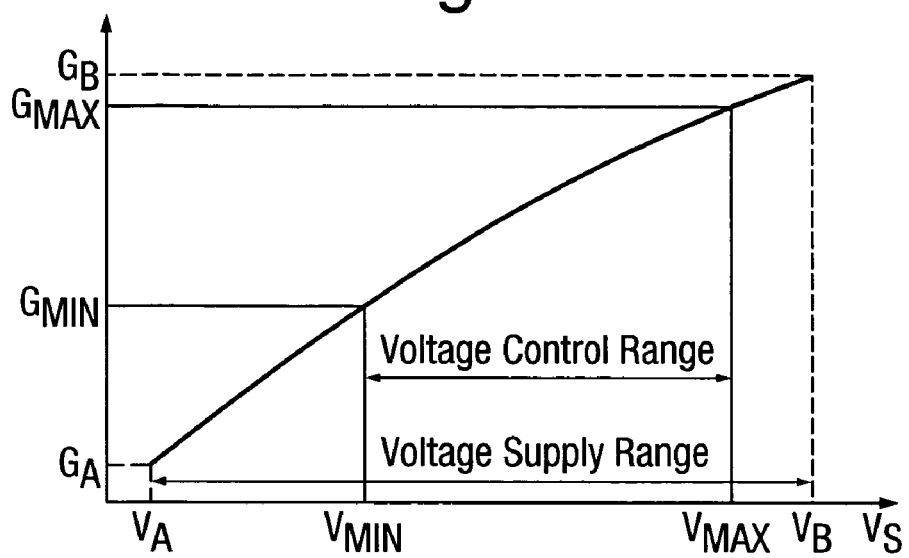
FIG. 3 is a graph of the gain of the power amplifier against supply voltage.
Figure 4:
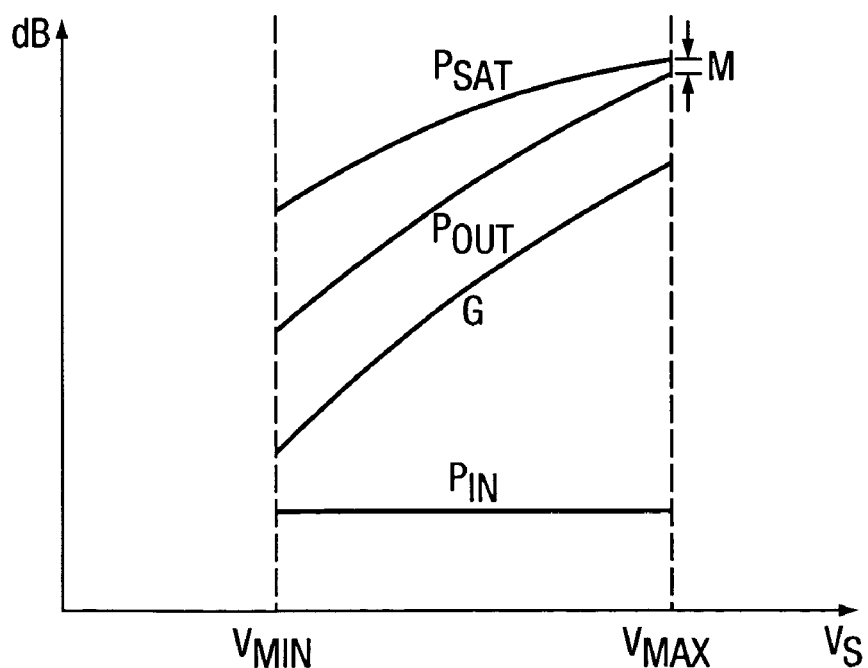
FIG. 4 is a graph of gain, input power, output power and saturation output power against supply voltage for a power amplifier of a first type.

The supply regulation performed by the supply regulation circuit 20 effects control of the output power $P_{OUT}$ over the predetermined power control range. This is achieved by virtue of the fact that the power amplifier 2 has a gain which reduces (and increases) as the supply voltage $V_S$ reduces (and increases). This is shown in FIG. 3 which is a graph of the gain G of the power amplifier 2 against the supply voltage $V_S$ over the voltage supply range of the power amplifier 2 from a lower limit $V_A$ to an upper limit $V_B$. The lower limit $V_A$ is a property of the power amplifier 2 and is typically 0.2V to 0.5V. The upper limit $V_B$ is typically equal to the voltage of the power supply rail $V_{BAT}$ and might be say 3.5V. As shown in FIG. 4, the output power $P_{OUT}$ is equal to the input power $P_{IN}$ plus the gain G of the power amplifier 2, the input power $P_{IN}$, output power $P_{OUT}$ and gain G being expressed in decibels.

The supply voltage $V_S$ is varied over a voltage control range from a minimum value $V_{MIN}$ to a maximum value $V_{MAX}$. This produces a corresponding change in gain G between minimum value $G_{MIN}$ and a maximum value $G_{MAX}$. This change in gain G of the power amplifier 2 causes a corresponding change in the output power $P_{OUT}$. The input power $P_{IN}$ remains constant and the power control across the entire power control range is effected by the control of the voltage supply $V_S$. To achieve this, it is necessary that the power amplifier 2 meets the condition that the change in gain G over the voltage supply range (i.e. ($G_B$–$G_A$) in decibels) is at least the change in output power over the predetermined power control range (i.e. ($G_{MAX}$–$G_{MIN}$) in decibels).

In principle, the voltage control range could be at any position across the voltage supply range of the power amplifier 2, but the voltage control range is preferably at the uppermost end of the voltage supply range so that the maximum value $V_{MAX}$ in the voltage control range is equal to the maximum value $V_B$ of the voltage supply range. The voltage control range may be across the entire voltage supply range to achieve the maximum possible predetermined power control range.

The condition on the gain G of the power amplifier 2 may be achieved by the design of the power amplifier 2, in particular the type of transistors used in the power amplifier 2. Many different types of power amplifier will have an appropriate gain characteristic. The transistors may be in general field effect transistors or bipolar transistors. For example, the power amplifier 2 may comprise Pseudomorphic High Electron Mobility Transistors (PHEMTs), preferably junction-PHEMTs (J-PHEMTs). For example, a suitable J-PHEMT power amplifier 2 is disclosed in N. Saka, M. Nakamura. et al., "Low Standby Leakage Current Power Amplifier Module made with Junction PHEMT technology," Gallium Arsenide Integrated Circuit (GaAs IC) Symposium, 2003, 25th Annual Digest 2003. IEEE, 9–12 November 2003. In this specific J-PHEMT it is possible to achieve a change in gain G of 25 dB over a voltage supply range from a minimum value $V_A$ of 0.5V to a maximum value $V_B$ of 3.5V.

To avoid distortion of the output signal $S_{OUT}$, the power amplifier 2 is arranged to provide that at each respective value of the supply voltage $V_S$ over the voltage control range, the output power $P_{OUT}$ is less than the saturation output power $P_{SAT}$ of the power amplifier 2. Generally speaking, this saturation output power $P_{SAT}$ is the power at which the voltage of the output signal $S_{OUT}$ reaches the supply voltage $V_S$ therefore resulting in clipping of the output signal $S_{OUT}$. Accordingly, the saturation output power $P_{SAT}$ at a given supply voltage $V_S$ is equal to $(V_S^2/R_L)$, where $R_L$ is the output load impedance. Thus, the saturation output power $P_{SAT}$ reduces as the power supply voltage $V_S$ reduces. To avoid saturation, the present invention takes advantage of the reduction in the gain G of the power amplifier 2 as the supply voltage $V_S$ reduces.

Figure 5:
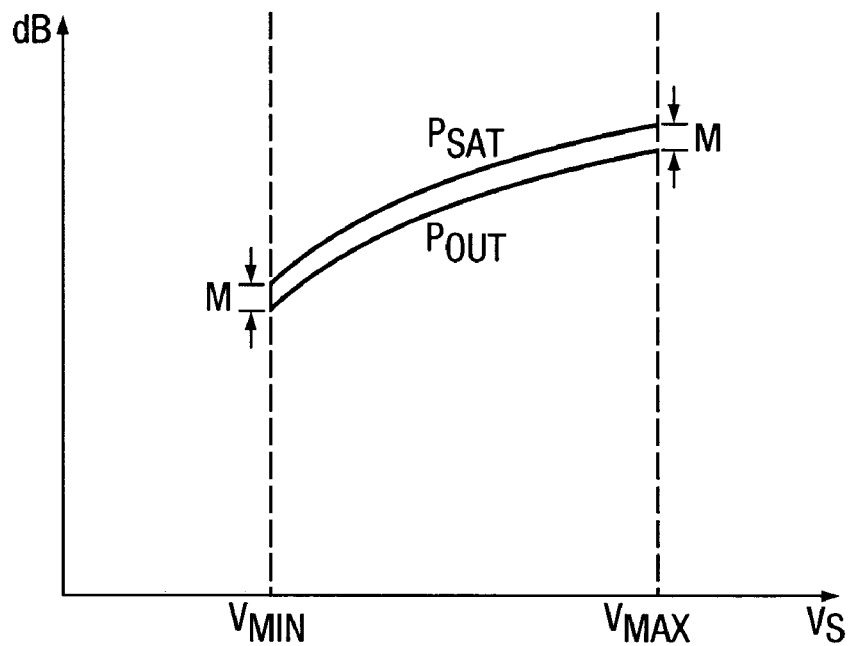
FIG. 5 is a graph of output power and saturation output power against supply voltage for a power amplifier of a second type.
Figure 6:
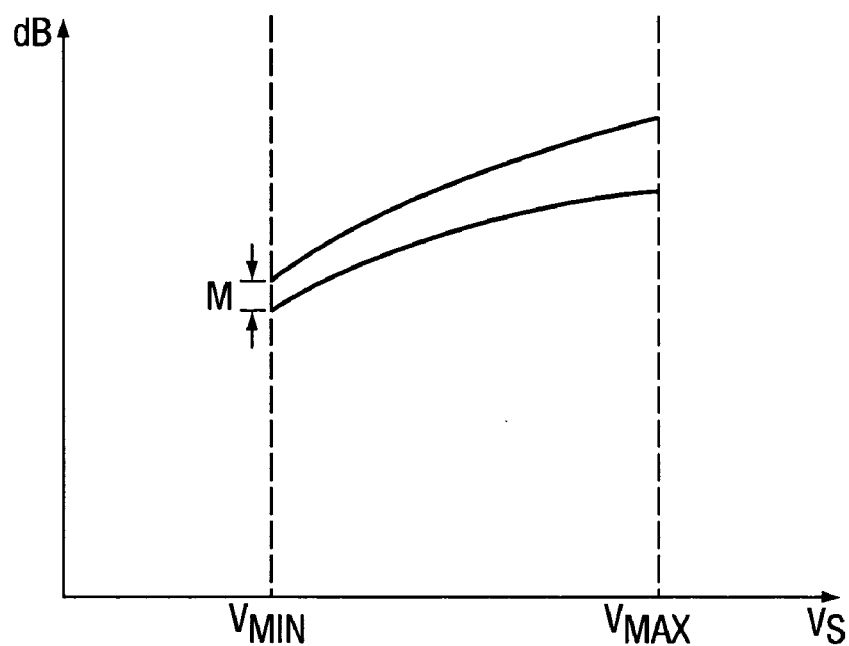
FIG. 6 is a graph of output power and saturation output power of a power amplifier against supply voltage for a power amplifier or amplifier stage of a third type.

The relationship between the output power $P_{OUT}$ and the saturation output power $P_{SAT}$ for three different types of embodiment are shown in FIGS. 4 to 6, which are each a graph of output power $P_{OUT}$ in decibels against supply voltage $V_S$ across the voltage control range. In each case, the output $P_{OUT}$ is less than the saturation output power $P_{SAT}$ by at least a back-off margin M which represents the difference in power between the peak and the mean of the modulation signal. For example, in case of the modulation in accordance with the EDGE specification, the back-off margin M is 3.5 dB. However, the relationship varies in the three types of embodiment shown in FIGS. 4 to 6 as follows.

In the type of embodiment shown in FIG. 4, the gain G of the power amplifier 2 and hence the output $P_{OUT}$ reduces at a rate which is quicker than the rate at which the saturation output power $P_{SAT}$ reduces. Thus, in FIG. 4, the two curves widen as the supply voltage $V_S$ reduces. In this case, the difference between the saturation output power $P_S$ and the actual output power $P_{OUT}$ is minimised at the maximum value $V_{MAX}$ of the voltage supply range. At lower supply voltages $V_S$, the roll-off in the gain G is sufficient to prevent saturation. The efficiency reduces as the output power $P_{OUT}$ is backed-off from the saturation output power, so this type of embodiment provides the best efficiency at the upper end of the voltage control range. This is desirable, because the absolute power loss (for a given efficiency) is greater at this upper region of the voltage control range because of the higher currents involved.

In the second alternative shown in FIG. 5, the gain G of the power amplifier 2 and hence the output power $P_{OUT}$ reduces at the same rate as the saturation output power $P_{SAT}$.

Thus, the same back-off margin M is maintained across the entire predetermined voltage control range. This is the preferred situation for maintaining optimum efficiency across the entire voltage supply range.

In the third type of embodiment shown in FIG. 6, the gain G of the power amplifier 2 and hence the output power $P_{OUT}$ reduces at a slower rate than the rate of which the saturation output power $P_{SAT}$ reduces across the voltage supply range. In this case, to maintain the output power $P_{OUT}$ below the saturation output power $P_{SAT}$ across the entire voltage supply range, the difference between the output power $P_{OUT}$ and the saturation output power $P_{SAT}$ is minimised at the minimum value $V_{MIN}$ of the voltage supply range and the two curves widen at higher supply voltages $V_S$. Whilst this type of embodiment is entirely workable, it provides generally worse efficiencies at higher supply voltages than the types of embodiment shown in FIGS. 4 and 5.

The condition on the output power $P_{OUT}$ and the saturation output power $P_{SAT}$ at the output of the power amplifier 2 applies equally to the output of each amplifier stage 3, 4 and 5 (the output of the third amplifier stage 5 being of course the output of the power amplifier 2). Thus, in respect of each respective amplifier stage 3, 4 and 5, at each respective value of the supply voltage in the voltage control range, the output power of the respective amplifier stage 3, 4 and 5 is less than the saturation output power of that respective amplifier stage 3, 4 and 5. This is preferable to limit distortion by clipping of the signal output from each respective amplifier stage 3, 4 and 5 as described above for the power amplifier 2 as a whole.

In considering this condition for the respective amplifier stages 3, 4 and 5, it is to be noted that the total gain G to be considered at the output of the second and third amplifier stages 4 and 5 is equal to the sum of the gains of all the preceding amplifiers stages 3, 4 and 5. For the first amplifier stage 3 and the second amplifier stage 4, the change in gain G at the output of that amplifier stage 3 or 4 over the voltage supply range is lower than the change in gain G at the output of the power amplifier 2. As a result, when considering the output of the first amplifier stage 3 and the second amplifier stage 4, the relationship between the output power $P_{OUT}$ and the saturation output power $P_{SAT}$ is generally closer to the relationship shown in FIG. 6 than the relationship shown in FIG. 4 or FIG. 5. This results in a relative reduction in efficiency in the operation of the first amplifier stage 3 and the second amplifier stage 4 at higher supply voltages $V_S$ within the voltage control range, as compared to the third amplifier stage 5. However, this cost in efficiency is less significant in terms of the overall efficiency, as compared to the output of the power amplifier 2 as a whole. This is because the level of the signals output by the first and second amplifier stages 3 and 4 is lower than the level of the output signal $S_{OUT}$ and so the first and second amplifier stages 3 and 4 draw less power compared to the final amplifier stage 5 and impact less on efficiency than the final amplifier stage 5.

It is straightforward to maintain the output power $P_{OUT}$ below the saturation output power $P_{SAT}$ at the output of the power amplifier 2, and similarly at the output of the first and second amplifier stages 3 and 4. In the case of a power amplifier 2 of an existing design, this may be achieved simply by backing-off the input power $P_{IN}$ of the input signal $S_{IN}$.

For a power amplifier 2 of a new design, the saturation output power $P_{SAT}$ of the power amplifier 2 and of the first and second amplifier stages 3 and 4 can be controlled as a design feature to maximise efficiency. In such a design process, the following considerations apply.

As noted above, the saturation output power $P_{OUT}$ of the power amplifier 2, and similarly the amplifier stages 3 and 4, is equal to $(V_S^2/R_L)$, where $V_S$ is the supply voltage and $R_L$ is the output load impedance. Furthermore, it is noted that the load impedance $R_L$ is inversely proportional to the size W of the transistors employed in the respective amplifier stage 3, 4 or 5 under consideration. This size W is a design feature which may be controlled. In general, oversizing the size W of a respective amplifier stage 3, 4 or 5 reduces the efficiency of that amplifier stage 3, 4 or 5. Therefore, to design the power amplifier 2, each amplifier stage 3, 4 and 5 is considered in turn and in respect of that amplifier stage 3, 4 or 5, the size of the transistors employed is reduced to reduce the saturation output power $P_{SAT}$ of that amplifier stage 3, 4 or 5 as far as possible whilst maintaining the condition that the output power $P_{OUT}$ of the amplifier stage 3, 4 or 5 in question is below the saturation output power $P_{SAT}$. This design process maximises the efficiency of the power amplifier 2 as a whole.

The power amplifier power control circuit 1 may be operated in different modes each for a different wireless communication network employing a respective type of modulation. There may be modes in which the input signals are modulated in accordance with different, variable envelope modulation schemes, for example the schemes in accordance with the EDGE specification and the WCDMA specification, respectively. In this case, in each mode, a different power control range is applicable, and so the voltage control range and the input power $P_{IN}$ of the input signal $S_{IN}$ are controlled accordingly.

In another mode, the power amplifier may be used to amplify input signals modulated in accordance with a constant envelope modulation scheme, for example a modulation scheme in accordance with the GSM specification. In this case, the control of the output power of the power amplifier 2 is again effected by regulation of the supply voltage $V_S$ by the supply regulation circuit 2 over an appropriate voltage control range.

Obviously, in any mode, the mobile-terminal 1 may operate to transmit and receive over different frequency bands, for example the frequency bands known as GSM850, GSM900, GSM1800 and GSM1900. In the different frequency bands, the desired power control range specified in the specification may differ.

At present, such multi-mode capability is highly desirable allow operation of the mobile terminal 1 with different wireless communication networks which may be encountered. A particular advantage of the present invention is that the same power amplifier power control circuit 1 may be applied to effect power control with all the different modulation schemes. This substantially reduces the variable gain amplifier requirements within a multi-mode direct modulation transceiver architecture. That is to say, where the variable element 14 is needed, the degree of power control effected is reduced, or in some cases the variable element 14 may be omitted altogether. This relaxation reduces overall current consumption and helps achieve stringent receive band noise requirements, thus assisting with the realisation of a single strip multi-mode transmit architecture. The use of a common power control amplifier control circuit 1 reduces circuit scale and complexity to a significant extent.

Figure 7:
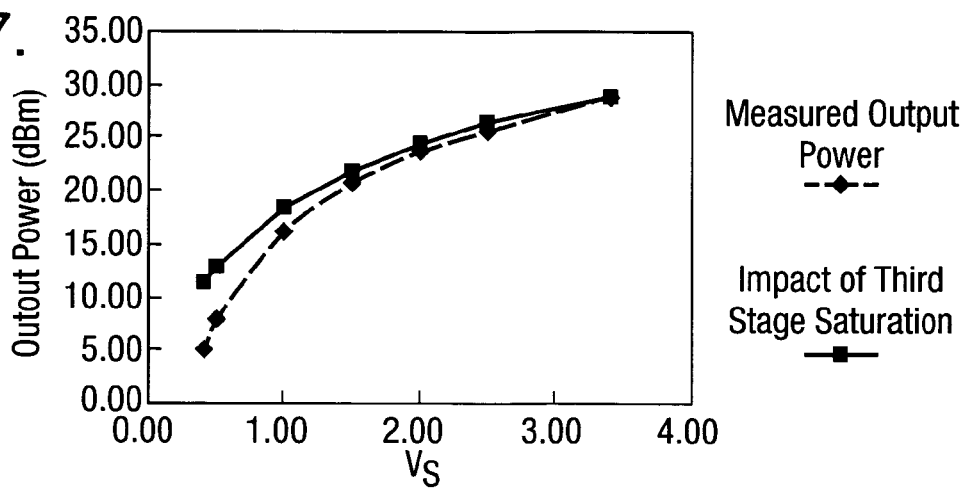
FIG. 7 is a graph of output power and saturation output power against supply voltage for a J-PHEMT power amplifier.

To demonstrate the benefits in terms of efficiency of the present invention, the power amplifier power control circuit 1 was applied to a power amplifier 2 in a form of a J-PHEMT power amplifier of the type disclosed in N. Saka, M. Nakamura et al., "Low Standby Leakage Current Power Amplifier Module made with Junction PHEMT technology", Gallium Arsenide Integrated Circuit (GaAs IC) Symposium, 2003, 25th Annual Digest 2003, IEEE, 9–12 November 2003. For this specific case, FIG. 7 shows the output power $P_{OUT}$ and the saturation output power $P_{SAT}$ for a range of supply voltages. The power amplifier power control circuit 1 was applied to the modulation scheme in accordance with the EDGE specification and the modulation scheme in accordance with the WCDMA specification and the following results were achieved.

Figure 8:
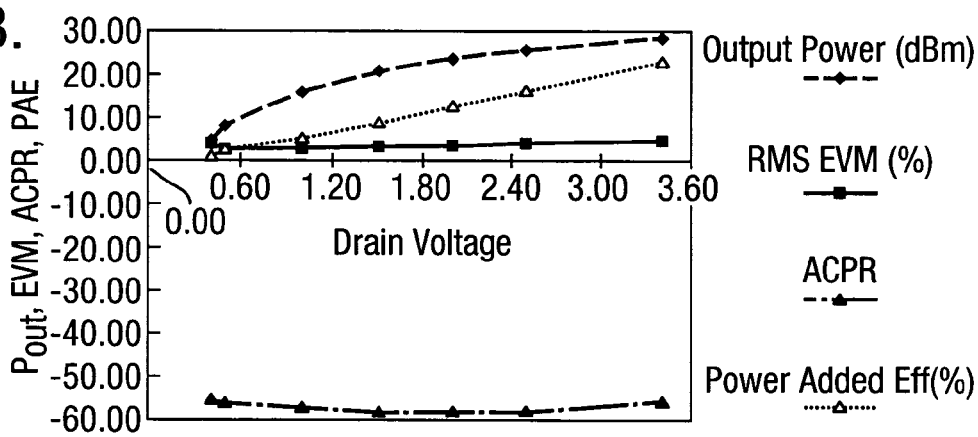
FIGS. 8 and 9 are graphs of the performance over supply voltage for a J-PHEMT power amplifier operated in accordance with the EDGE specification.

Dealing with the EDGE modulation scheme first, the power amplifier 2 was re-biased closer to class A and the input power reduced by around 10 dB such that the output power $P_{OUT}$ reduced to 28.5 dBm in order to meet the EDGE Power Class E2 specification of 27 dBm at the antenna (assuming approximately 1.5 dB loss between the PA and antenna port). The power amplifier 2 was now operating outside compression with sufficient margin for the 3.5 dB peak-mean power difference associated with the EDGE modulation scheme. At the nominal supply voltage of 3.2V (after the drain PMOS device), the EVM, ACPR and efficiency were measured, whilst keeping the existing GSM matching circuits (EVM: error vector magnitude; ACPR: adjacent channel power ratio). An efficiency of 23% resulted, with EVM and ACPR (400 KHz offset) inside specification at 4.3% and −56 dBc, respectively. The drain voltage was then reduced and modulation monitored. FIG. 8 illustrates the resulting EVM and ACPR performance across the control range. EVM remains below 5% and ACPR well inside specification (−54 dBc @400 KHz or −36 dBm) over the complete control range.

Figure 9:
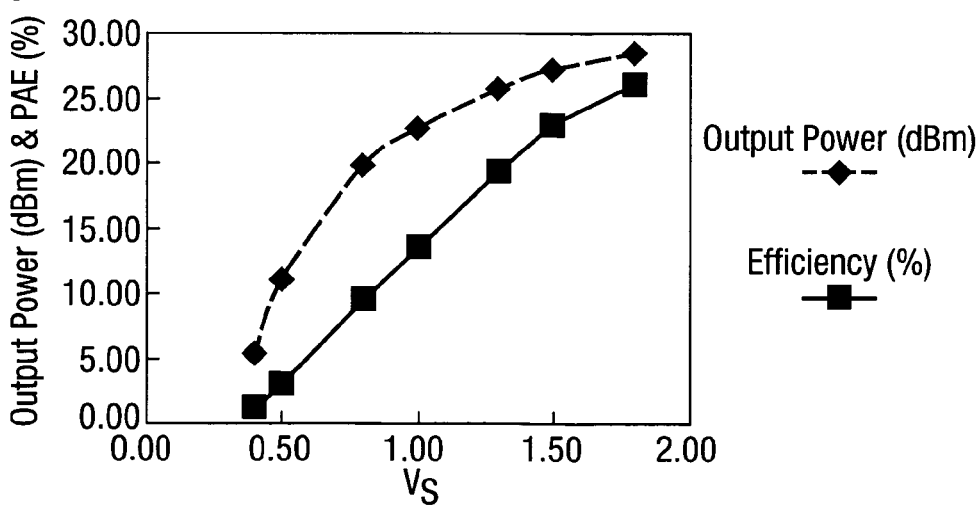

The output power and efficiency were measured against supply voltage $V_S$. FIG. 9 illustrates the efficiency and output power performance over the control range whilst keeping inside the EVM and ACPR limits. The smooth output power/$V_S$ characteristic permits a well behaved loop characteristic.

Figure 10:
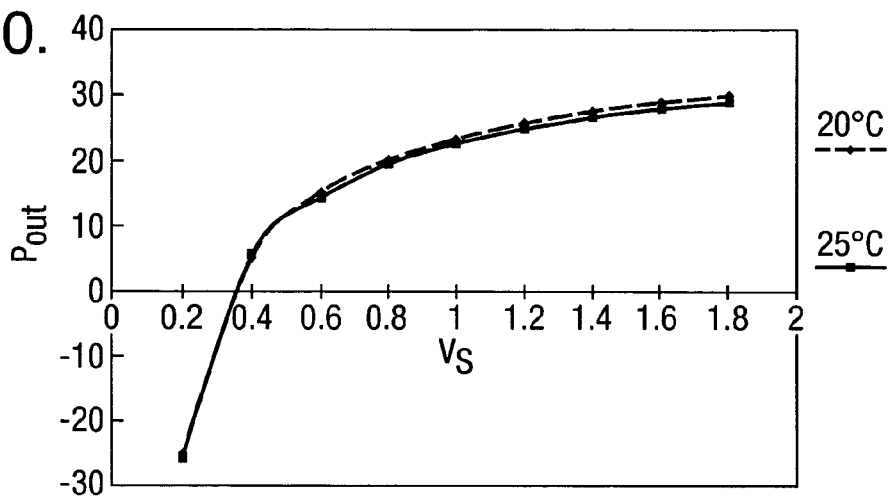
FIG. 10 is a graph of the output power over supply voltage for different temperatures for a J-PHEMT power amplifier operated in accordance with the EDGE specification.

Over temperature, the characteristic also proved to be well behaved with less than +/−1 dB variation from −20 to +85°, as shown in FIG. 10. The low variation over temperature and the flatness across frequency bands also make it possible to eliminate the output coupler and power detector circuits which are often used for linear power amplifier solutions, such that the method of open-loop drain control is used for both GSM and EDGE modes. Furthermore, it was also possible to remove the isolator associated with other linear power amplifier solutions. Measured VSWR variations of 3:1 at the PA output were found to degrade EVM by around only 2% at worst case phase.

Receive band RX noise was measured at 10–30 MHz offset from carrier and found to meet the requirements with value of −84 dBm in 100 KHz at 20 MHz offset.

Figure 11:
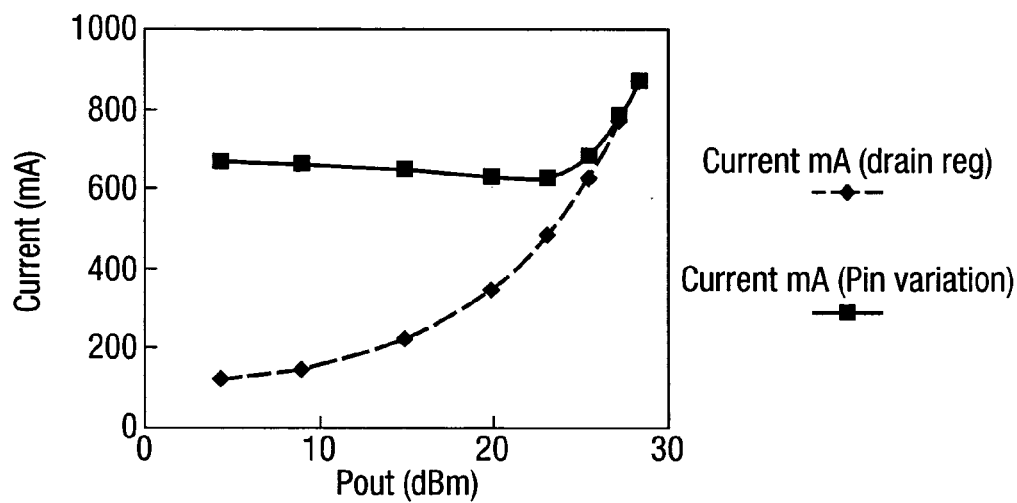
FIG. 11 is a graph of current consumption against supply voltage comparing the power control technique of the present invention with the known back-off variable gain amplifier technique.

This method of power control permits significant improvements in efficiency to be achieved at typical handset operating powers (10–20 dBm) compared to the standard linear power amplifiers. Performance under typical operating conditions is not substantially different to polar loop solutions, whilst the need for additional complex control loops is avoided. The relative improvement in efficiency is brought about by the fact that the reduction in drain voltage results in a corresponding reduction in drain current. FIG. 11 illustrates the supply current consumption variation with output power for the drain controlled linear power amplifier 2 compared with the conventional approach of using an external variable gain amplifier and a fixed supply voltage $V_S$. Whilst consumption is similar at full output power, substantial savings are incurred in the typical handset operating region of 10–20 dBm.

The efficiency improvements brought about by drain regulation can be further exploited by use of DC-DC converters instead of the conventional PMOS supply regulator. The following table illustrates the efficiency comparisons between the power amplifier power control circuit 1 and the conventional back-off variable gain amplifier technique (assuming 20 mA consumption for the variable gain amplifier) and at three different output powers. For the drain controlled linear PA, 3 cases are considered: conventional PMOS supply regulations; regulation based upon an ideal DC-DC converter and envelope drain modulation based upon a fast DC-DC converter. The latter requires the use of AM-AM correction loops, thus achieving the improved efficiency at the expense of greater complexity.

| Output Power Level | 28.5 dBm | 20.0 dBm | 10.0 dBm |
|---|---|---|---|
| Conventional Power Control (assuming 20 mA VGA consumption) | 21.6% | 6.7% | 1.1% |
| Supply Regulation by PMOS Regulator, based on measurements | 23% | 10.0% | 3.5% |
| Supply Regulation by Ideal DC-DC Converter power control based on measurements | 23% | 20% | 17.5% |
| Supply Regulation by fast DC-DC converter (ideal) for envelope tracking and power control, base on simulation | 32% | 28% | 24.5% |

Figure 12:
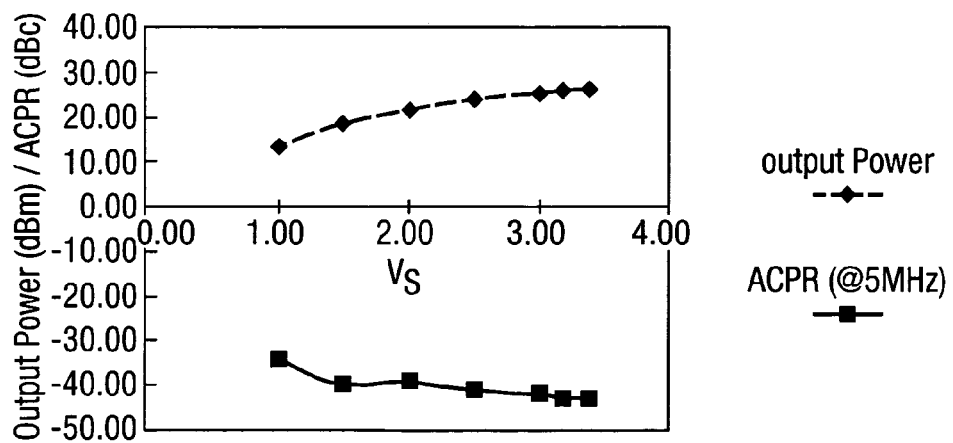
FIG. 12 is a graph of the performance over supply voltage for a J-PHEMT power amplifier operated in accordance with the WCDMA specification.

The power amplifier power control circuit 1 was also measured with a WCDMA modulation scheme within the European UMTS frequency band. ACPR performance could be maintained over the top 10–20 dB of control range, as shown in FIG. 12, thus relaxing the requirements on the high dynamic range TX variable gain amplifier required for WCDMA (a total of 90 dB range is necessary). As with the case of EDGE, significant efficiency improvements could be realised compared to conventional control.

The invention claimed is:

1. A method of providing power control of a power amplifier used to amplify input signals modulated in accordance with a variable envelope modulation scheme, the power control being effective to control the output power of signals amplified by the power amplifier to be within a predetermined power control range, the method comprising:
providing a power amplifier having a gain which reduces as the supply voltage to the power amplifier reduces, the change in gain over the voltage supply range of the power amplifier being at least the change in output power over the predetermined power control range; and
during operation of said power amplifier to amplify input signals modulated in accordance with the variable envelope modulation scheme, controlling the output power of the power amplifier by regulation of the supply voltage to the power amplifier over a voltage control range, the power amplifier being arranged to provide that at each respective value of the supply voltage in the voltage control range the output power of the power amplifier is less than the saturation output power of the power amplifier.

2. A method according to claim 1, wherein the power amplifier has a plurality of amplifier stages.

3. A method according to claim 2, wherein the power amplifier has three amplifier stages.

4. A method according to claim 2, wherein said regulation of the supply voltage to the power amplifier comprises regulating the supply voltage to at least one amplifier stage.

5. A method according to claim 2, wherein said regulation of the supply voltage to the power amplifier comprises regulating the supply voltage to each one of the amplifier stages.

6. A method according to claim 2, wherein the amplifier stages are arranged to provide that, in respect of each respective amplifier stage, at each respective value of the supply voltage in the voltage control range the output power of the respective amplifier stage is less than the saturation output power of the respective amplifier stage.

7. A method according to claim 1, wherein, across the voltage control range of the supply voltage, the gain of the power amplifier in decibels reduces at rate which is no more than the rate at which the saturation output power of the power amplifier in decibels reduces.

8. A method according to claim 1, wherein the power amplifier is arranged to provide that at each respective value of the supply voltage in the voltage control range the output power of the power amplifier is less than the saturation output power of the power amplifier by at least a back-off margin which represents the difference in power between the peak and the means of the modulation signal.

9. A method according to claim 1, wherein said predetermined power control range is one of:
  0 dBm to 26 dBm in the case of said variable envelope modulation scheme being 3π/8-8PSK modulation in accordance with the DCS1800 or PCS1900 bands of the EDGE specification class E2;
  5 dBm to 27 dBm in the case of said variable envelope modulation scheme being 3π/8-8PSK in accordance with the GSM850 or GSM900 bands of the EDGE specification class E2; and
  −50 dBm to 24 dBm in the case of said variable envelope modulation scheme being HPSK modulation in accordance with the WCDMA specification,
  in each case plus an offset to account for power loss between the output of the power amplifier and an antenna.

10. A method according to claim 1, wherein the power amplifier comprises field-effect transistors.

11. A method according to claim 10, wherein the power amplifier comprises Pseudomorphic High Electron Mobility Transistors.

12. A method according to claim 1, wherein said regulation of the supply voltage is performed by detecting the error between a desired supply voltage and the actual level of the supply voltage, and controlling the supply voltage in accordance with the detected error.

13. A method according to claim 1, wherein:
  the power amplifier is also used to amplify input signals modulated in accordance with a constant envelope modulation scheme; and
  during operation of said power amplifier to amplify input signals modulated in accordance with the constant envelope modulation scheme, controlling the output power of the power amplifier by regulation of the supply voltage to the power amplifier over a further voltage control range.

14. A method according to claim 1, further comprising controlling the output power of the power amplifier over a further power control range outside the predetermined power control range by varying the input power of signals input to the power amplifier.

15. A power amplifier power control circuit of a power amplifier operable to amplify signals modulated in accordance with a variable envelope modulation scheme, the power amplifier control system being capable of controlling the output power of signals amplified by the power amplifier to be within a predetermined power control range, wherein:
  the power amplifier has a gain which reduces as the supply voltage to the power amplifier reduces, the change in gain over the voltage supply range of the power amplifier being at least the change in output power over the predetermined power control range;
  the power amplifier control system comprises a supply regulation circuit operable, during operation of said power amplifier to amplify input signals modulated in accordance with the variable envelope modulation scheme, to regulate the supply voltage to the power amplifier and thereby control the output power of the power amplifier, the power amplifier being arranged to provide that the output voltage is below the saturation output voltage of the power amplifier across the entire predetermined power control range.

16. A power amplifier power control circuit according to claim 15, wherein the power amplifier has a plurality of amplifier stages.

17. A power amplifier power control circuit according to claim 16, wherein the power amplifier has three amplifier stages.

18. A power amplifier power control circuit according to claim 16, wherein said supply regulation circuit is operable to regulate the supply voltage to at least one amplifier stage.

19. A power amplifier power control circuit according to claim 16, wherein said supply regulation circuit is operable to regulate the supply voltage to each one of the amplifier stages.

20. A power amplifier power control circuit according to claim 16, wherein the amplifier stages are arranged to provide that, in respect of each respective amplifier stage, at each respective value of the supply voltage in the voltage control range the output power of the respective amplifier stage is less than the saturation output power of the respective amplifier stage.

21. A power amplifier power control circuit according to claim 15, wherein, across the voltage control range of the supply voltage, the gain of the power amplifier in decibels reduces at rate which is no more than the rate at which the saturation output power of the power amplifier in decibels reduces.

22. A power amplifier power control circuit according to claim 15, wherein the power amplifier is arranged to provide that at each respective value of the supply voltage in the voltage control range the output power of the power amplifier is less than the saturation output power of the power amplifier by at least a back-off margin which represents the difference in power between the peak and the means of the modulation signal.

23. A power amplifier power control circuit according to claim 15, wherein said predetermined power control range is one of:
  0 dBm to 26 dBm in the case of said variable envelope modulation scheme being 3π/8-8PSK modulation in accordance with the EDGE specification; and 5 dBm to 27 dBm in the case of said variable envelope modulation scheme being 3π/8-8PSK in accordance with the GSM850 or GSM900 bands of the EDGE specification class E2; and −50 dBm to 24 Dbm in the case of said variable envelope modulation scheme being HPSK modulation in accordance with the WCDMA specification, in each case plus an offset to account for power loss between the output of the power amplifier and an antenna.

24. A power amplifier power control circuit according to claim 15, wherein the power amplifier comprises field-effect transistors.

25. A power amplifier power control circuit according to claim 24, wherein the power amplifier comprises Pseudomorphic High Electron Mobility Transistors.

26. A power amplifier power control circuit according to claim 15, wherein said supply regulation system comprises:
   a control element arranged to control the supply voltage;
   a feedback loop arranged to feed back the level of the supply voltage; and
   an error detector arranged to detect the error between the level of the supply voltage fed back by the feedback loop with a desired supply voltage, and to control the control element in accordance with the detected error.

27. A power amplifier power control circuit according to claim 15, wherein:
   the power amplifier is also operable to amplify input signals modulated in accordance with a constant envelope modulation scheme; and
   the supply regulation circuit is operable, during operation of said power amplifier to amplify input signals modulated in accordance with the constant envelope modulation scheme, to regulate the supply voltage to the power amplifier and thereby control the output power of the power amplifier.

28. A power amplifier power control circuit according to claim 15, further comprising a variable element arranged to control the input power of signals input to the power amplifier and thereby control the output power of the power amplifier over a further power control range outside the predetermined power control range.

29. A mobile terminal for a wireless communication network having a transmission circuit including a power amplifier power control circuit according to claim 15.

* * * * *